(12) United States Patent
Watanabe et al.

(10) Patent No.: US 8,466,702 B2
(45) Date of Patent: Jun. 18, 2013

(54) TEST SYSTEM AND SUBSTRATE UNIT FOR TESTING

(75) Inventors: Daisuke Watanabe, Saitama (JP); Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 274 days.

(21) Appl. No.: 12/953,352

(22) Filed: Nov. 23, 2010

(65) Prior Publication Data
US 2011/0128031 A1 Jun. 2, 2011

Related U.S. Application Data

(63) Continuation of application No. PCT/JP2008/060175, filed on Jun. 2, 2008.

(51) Int. Cl.
G01R 31/20 (2006.01)
G01R 31/02 (2006.01)

(52) U.S. Cl.
USPC .............................. 324/754.07; 324/762.01

(58) Field of Classification Search
USPC .......................................... 324/754.07, 762.01
See application file for complete search history.

(56) References Cited

U.S. PATENT DOCUMENTS

| | | | | |
|---|---|---|---|---|
| 5,642,054 A * | 6/1997 | Pasiecznik, Jr. | ......... | 324/755.09 |
| 5,818,249 A * | 10/1998 | Momohara | ............... | 324/756.03 |
| 6,400,173 B1 * | 6/2002 | Shimizu et al. | ........... | 324/754.07 |
| 7,649,366 B2 * | 1/2010 | Henson et al. | ........... | 324/754.03 |
| 7,847,572 B2 * | 12/2010 | Watanabe et al. | ........... | 324/750.3 |
| 7,924,035 B2 * | 4/2011 | Huebner | ................... | 324/754.01 |
| 8,269,515 B2 * | 9/2012 | Mayder | ..................... | 324/754.07 |
| 8,305,101 B2 * | 11/2012 | Desta et al. | ............... | 324/755.01 |
| 2003/0160626 A1 | 8/2003 | Maruyama et al. | | |
| 2003/0189439 A1 * | 10/2003 | Kohno et al. | ................. | 324/754 |
| 2004/0175850 A1 | 9/2004 | Shimizu et al. | | |
| 2005/0225336 A1 | 10/2005 | Kojima | | |
| 2008/0010824 A1 | 1/2008 | Kojima | | |

FOREIGN PATENT DOCUMENTS

| | | |
|---|---|---|
| JP | 2001-210685 A | 8/2001 |
| JP | 2002-222839 A | 8/2002 |
| JP | 2003-139799 A | 5/2003 |
| JP | 2004-288911 A | 10/2004 |
| TW | 200525160 A | 8/2005 |
| TW | 200745572 A | 12/2007 |
| WO | 03/062837 A1 | 7/2003 |

OTHER PUBLICATIONS

International Search Report (ISR) issued in PCT/JP2008/060175 (parent application) mailed in Sep. 2008 for Examiner consideration.
Written Opinion (PCT/ISA/237) issued in PCT/JP2008/060175 (parent application) mailed in Sep. 2008.

(Continued)

Primary Examiner — Joshua Benitez Rosario

(57) ABSTRACT

A test system that tests a plurality of chips under test formed on a wafer under test, the test system comprising a plurality of test substrates that are arranged in overlapping layers and that each have a plurality of test circuits, whose function is determined for each wafer, formed thereon; a plurality of connecting sections that electrically connect, to the chips under test, the test circuits formed on one of the test substrates; and a control apparatus that controls each of the test circuits. Each test substrate has test circuits, with a function predetermined for each substrate, formed thereon.

11 Claims, 7 Drawing Sheets

OTHER PUBLICATIONS

Taiwanese Office Action dated Aug. 29, 2012, in a counterpart Taiwanese patent application No. 098118195.

Korean Office Action dated Sep. 30, 2011, in a counterpart Korean Patent application No. 10-2010-7025263.

* cited by examiner

TEST SYSTEM AND SUBSTRATE UNIT FOR TESTING

BACKGROUND

1. Technical Field

The present invention relates to a test substrate unit and a test system for testing a semiconductor chip. In particular, the present invention relates to a test substrate unit and a test system for testing a plurality of semiconductor chips formed on a semiconductor wafer.

2. Related Art

For testing semiconductor chips, an apparatus is known that judges pass/fail of each of a plurality of semiconductor chips formed on a semiconductor wafer, as shown in Japanese Patent Application Publication No. 2002-222839. This apparatus can be provided with a probe card that is electrically connectable to a plurality of semiconductor chips en bloc. Related art is also described in International Publication WO 2003/062837.

Generally, the probe card is formed using a print substrate, as shown in Patent Document 2. By forming a plurality of probe pins on this print substrate, the resulting probe card can be electrically connected to a plurality of semiconductor chips en bloc.

One method for testing semiconductor chips involves using BOST circuits. In this case, the BOST circuits can be loaded on the probe card, but when testing a plurality of semiconductor chips on a semiconductor wafer, the number of necessary BOST circuits is large and it becomes difficult to load the BOST circuits on the print substrate of the probe card.

Another method for testing semiconductor chips involves using BIST circuits provided in the semiconductor chips. With this method, however, circuits that are not used for actual operation are formed in the semiconductor chips, and therefore the space for circuits that are used for actual operation is decreased.

When testing semiconductor chips, a variety of tests can be performed including a DC test to judge whether the DC power consumed by a semiconductor chip fulfills certain specifications, a function test to judge whether a semiconductor chip outputs a prescribed output signal in response to an input signal, and an analog test to judge whether the characteristics of the signal output by a semiconductor chip fulfill certain specifications. However, it is difficult to perform such a wide variety of tests using BOST circuits on the print substrate or BIST circuits in the semiconductor chips.

SUMMARY

Therefore, it is an object of an aspect of the innovations herein to provide a (test system and a test substrate unit, which are capable of overcoming the above drawbacks accompanying the related art. The above and other objects can be achieved by combinations described in the independent claims. The dependent claims define further advantageous and exemplary combinations of the innovations herein. According to a first aspect related to the innovations herein, provided is a test system that tests a plurality of chips under test formed on a wafer under test, the test system comprising a plurality of test substrates that are arranged in overlapping layers and that each have a plurality of test circuits formed thereon; a plurality of connecting sections that transmit, to the chips under test, signals generated by the test circuits formed on one of the test substrates; and a control apparatus that controls each of the test circuits.

According to a second aspect related to the innovations herein, provided is a test substrate unit that tests a plurality of chips under test formed on a wafer under test, the test substrate unit comprising a plurality of test substrates that are arranged in overlapping layers and that each have a plurality of test circuits formed thereon; and a plurality of connecting sections that transmit, to the chips under test, signals generated by the test circuits formed on one of the test substrates.

According to a third aspect related to the innovations herein, provided is a test system that tests a plurality of chips under test formed on a wafer under test, the test system comprising a plurality of test substrates that are arranged in overlapping layers and that each have a plurality of test circuits formed thereon; and a control apparatus that controls each of the test circuits. Each test substrate has formed thereon a plurality of test circuits having a function predetermined for the substrate.

According to a fourth aspect related to the innovations herein, provided is a test substrate unit that tests a plurality of chips under test formed on a wafer under test, the test substrate unit comprising a plurality of test substrates that are arranged in overlapping layers and that each have a plurality of test circuits formed thereon. Each test substrate has formed thereon a plurality of test circuits having a function predetermined for the substrate.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
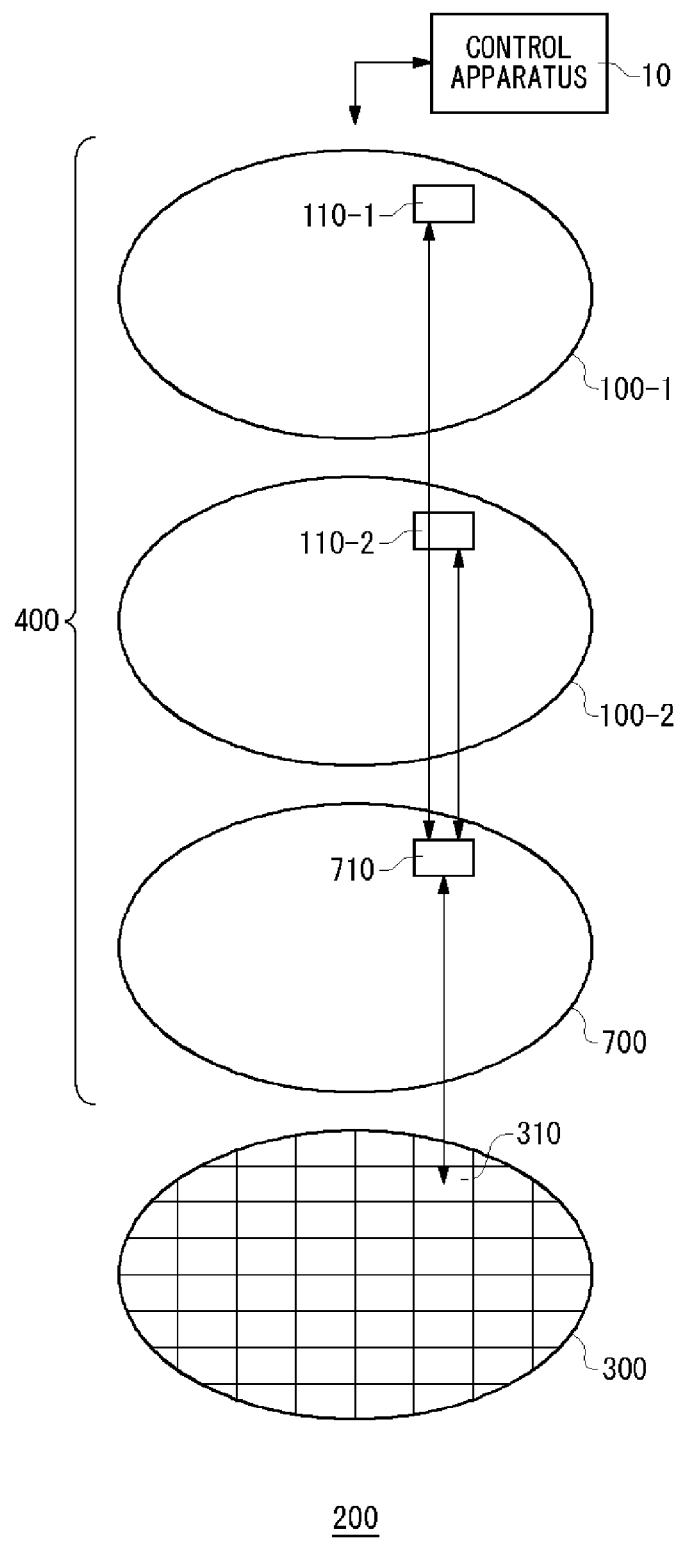
FIG. 1 shows the basics of testing by a test system 200.

FIG. 1 shows the basics of testing by a test system 200. The test system 200 uses a test substrate unit 400 to test each chip under test 310 of a wafer under test 300.

The test system 200 includes the control apparatus 10 and a the test substrate unit 400. The test substrate unit 400 is connected to the chips under test 310 of the wafer under test 300 en bloc in a manner to exchange signals with the chips under test 310, and tests each of the chips under test 310 in parallel. The test substrate unit 400 may include a plurality of test circuits 110 corresponding to the chips under test 310. Each test circuit 110 may test the corresponding chip under test 310. Each test circuit 110 may correspond to a plurality of pins to be tested in the corresponding chip under test 310, or a test circuit 110 may be provided for each pin to be tested in a chip under test 310.

The control apparatus 10 controls the test substrate unit 400 to test each of the chips under test 310. For example, the control apparatus 10 may supply each test circuit 110 with a trigger signal to begin testing.

The test substrate unit 400 includes a plurality of test substrates 100 and a connecting unit 700. FIG. 1 shows an example in which the test substrate unit 400 includes two test substrates 100.

The test substrates 100 and the connecting unit 700 may each be formed of the same semiconductor material as the wafer under test 300. For example, these substrates may be silicon wafers. The test substrates 100 and the connecting unit 700 may each have substantially the same diameter as the wafer under test 300. The test system 200 in the present example uses a semiconductor wafer that has substantially the same diameter as the wafer under test 300 for the connecting unit 700, and this connecting unit 700 electrically connects to the chips under test 310 en bloc.

In each test substrate 100 is formed a plurality of test circuits 110 corresponding to the chips under test 310, and each test circuit 110 has a function predetermined for each wafer. For example, test circuits 110 with different functions may be formed in different test substrates 100. More specifically, the first test substrate 100-1 may include a plurality of test circuit 110-1s that correspond respectively to the chips under test 310 and perform DC testing on the chips under test 310. The second test substrate 100-2 may include a plurality of test circuit 110-2s that correspond respectively to the chips under test 310 and perform analog testing on the chips under test 310. In FIG. 1, a test circuit 110 corresponding to a single chip under test 310 is shown in each test substrate 100, and other test circuits 110 are not shown.

The test substrates 100 are arranged in stacked layers. For example, the back side of the first test substrate 100-1 and the front side of the second test substrate 100-2 may be affixed to each other via a anisotropic sheet.

The connecting unit 700 is disposed between the wafer under test 300 and the test substrate 100 closest to the wafer under test 300. The connecting unit 700 in the present example is disposed between the second test substrate 100-2 and the wafer under test 300, and forms a signal transmission path between pads on the second test substrate 100-2 and pads on the wafer under test 300.

The connecting unit 700 includes a plurality of connecting sections 710 corresponding to the plurality of chips under test 310. For example, the connecting unit 700 may include a plurality of connecting sections 710 corresponding one-to-one with the chips under test 310. FIG. 1 shows a connecting section 710 corresponding to a single chip under test 310, and other connecting sections 710 are not shown.

Each connecting section 710 supplies the corresponding chip under test 310 with a signal generated by a test circuit 110 disposed in a test substrate 100. For example, each connecting section 710 may connect a signal transmission path from a test circuit 110 to the corresponding chip under test 310. These signal transmission paths may include electric signal paths or optical signal paths. Some of these signal transmission paths may include non-contact transmission paths using electrostatic coupling or inductive coupling. The following describes an example in which electric signal transmission paths are used as the transmission paths. Each connecting section 710 may switch which test substrate's 100 test circuit 110 is connected to the corresponding chip under test 310. Instead, each connecting section 710 may connect the test circuit 110 of a predetermined test substrate 100 to the corresponding chip under test 310.

In other words, each connecting section 710 selects a function by determining which test circuit 110 is connected to the corresponding chip under test 310. With this configuration, test substrates 100 or the like disposed near the wafer under test 300 can be used to perform a variety of tests on the chips under test 310. Furthermore, in a conventional test apparatus, signals for testing are transmitted via short pins, a cable, or the like, but in the test system 200 of the present example, the chips under test 310 can be tested more accurately because the transmission path between the test circuits 110 and the chips under test 310 can be shortened. Since the wafer under test 300 and the connecting unit 700 have the same substrate material, the thermal expansion coefficients of these wafers are substantially the same, thereby improving reliability of the electrical connection between the wafer under test 300 and the connecting unit 700.

The connecting sections 710 may be respectively electrically connected to the test circuits 110 of each test substrate 100. In this case, each test substrate 100 via holes that allow the test circuits 110 of the test substrate 100 further from the connecting unit 700 to bypass the test substrates 100 closer to the connecting unit 700. For example, the test circuits 110 of the first test substrate 100-1 may be electrically connected to the connecting section 710 through via holes formed in the second test substrate 100-2.

The connecting sections 710 may be electrically connected to the corresponding test circuits 110 through a plurality of via holes. Each connecting section 710 may connect the corresponding chip under test 310 to one of the test circuits 110 through a via hole.

Figure 2:
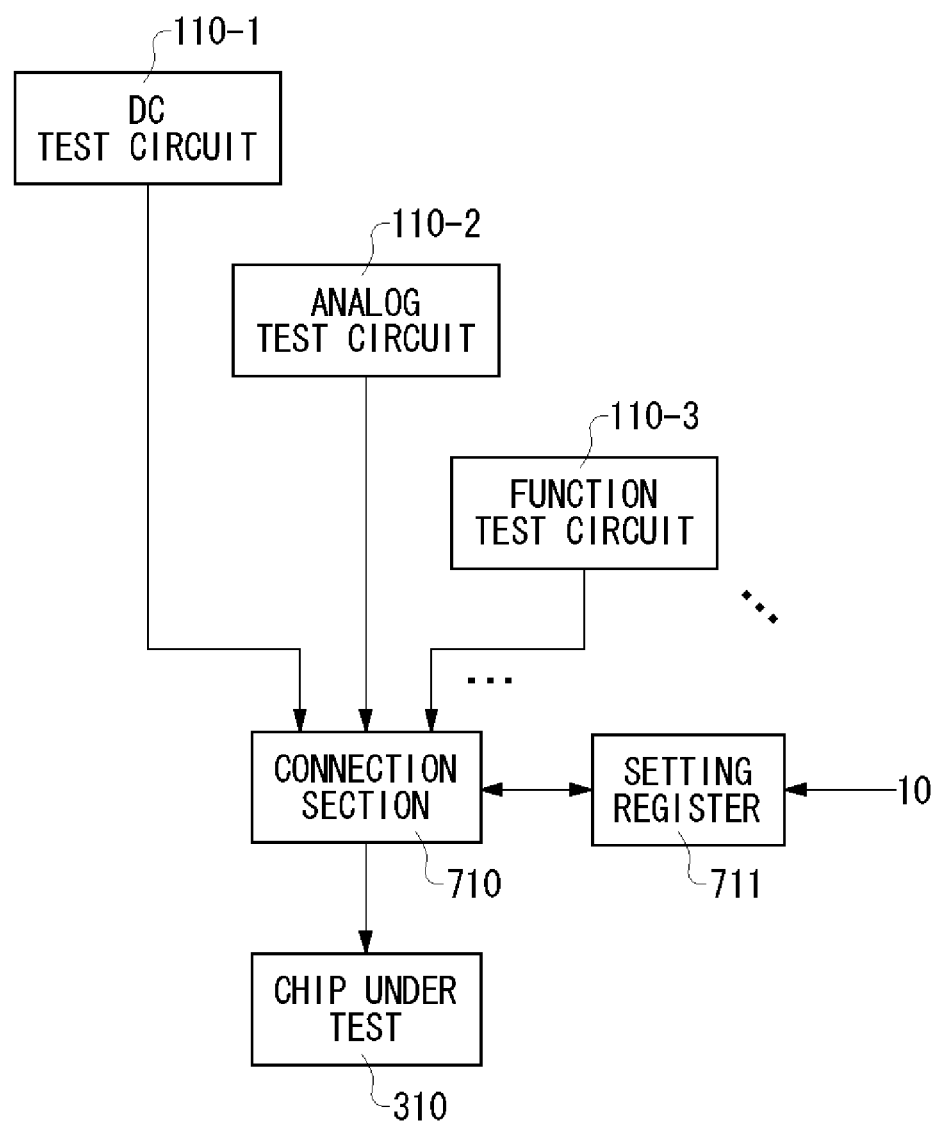
FIG. 2 shows exemplary test circuits 110 on a plurality of test substrates 100.

FIG. 2 shows exemplary test circuits 110 on a plurality of test substrates 100. In FIG. 2, one test circuit 110 of each test substrate 100 is shown. As described above, each test substrate 100 includes test circuits 110 having a function that is predetermined for each wafer.

For example, the first test substrate 100-1 may include a test circuit 110-1 that performs DC testing of a chip under test 310. The DC testing may involve judging whether power supply voltage or power supply current provided to the chip under test 310 is within a prescribed range.

The second test substrate 100-2 may include a test circuit 110-2 that performs analog testing of the chip under test 310. The analog testing may involve judging whether an analog waveform of a signal output by the chip under test 310 fulfills certain specifications.

The third test substrate 100-3 may include a test circuit 110-3 that performs function testing of the chip under test 310. The function testing may involve judging whether the logic pattern of a response signal output by the chip under test 310 when a prescribed logic pattern is input to the chip under test 310 matches a prescribed expected value pattern.

The tests performed by the test system 200 are not limited to the above tests. The test substrates 100 may be provided with test circuits 110 corresponding to a variety of tests, including a scan test and a jitter tolerance of the chip under test 310.

Furthermore, test circuits 110 of test substrates 100 closer to the wafer under test 300 may generate higher-frequency signals for testing the chips under test 310. For example, test circuits 110 performing DC testing may be provided to a test substrate 100 further from the wafer under test 300 than the test substrate 100 to which test circuits 110 performing high-frequency analog testing are provided. In other words, by arranging test circuits 110 that use high frequency signals to test the chips under test 310 closer to the chips under test 310, the chips under test 310 can be more accurately tested because the transmission distance of the high frequency signals is decreased.

As described above, the connecting sections 710 each determine which test substrate's 100 test circuit 110 is connected to the corresponding chip under test 310. Each connecting section 710 may include a multiplexer that selects a test circuit 110. In this case, the connecting unit 700 includes a setting register 711 for each connecting section 710.

The setting registers 711 cause the connecting sections 710 to select test circuits 110 corresponding to setting information written in advance. The control apparatus 10 may write setting information to the setting registers 711. The control apparatus 10 may write the same setting information to each setting register 711, or may write different setting information to each setting register 711. By using a plurality of types of test circuits 110 near the chips under test 310 in this way, a variety of tests can be accurately performed on the chips under test 310.

Figure 3:
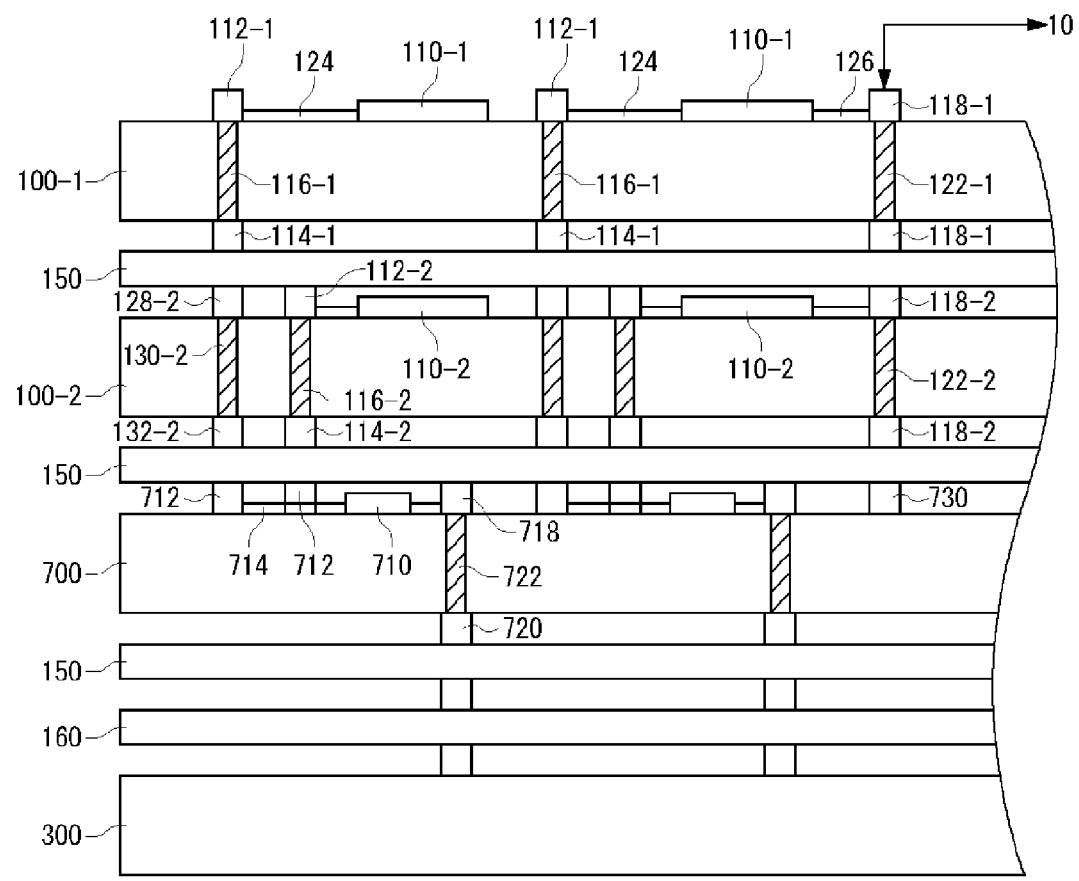
FIG. 3 shows an exemplary cross section of the test substrate unit 400 and the wafer under test 300.

FIG. 3 shows an exemplary cross section of the test substrate unit 400 and the wafer under test 300. As described above, the test circuits 110 are each electrically connected to a connecting section 710 through via holes formed in the test substrates 100.

The first test substrate 100-1 on the uppermost layer may include a plurality of test circuit 110-1s, a plurality of signal via holes 116-1, a plurality of top surface pads 112-1, a plurality of bottom surface pads 114-1, a plurality of wires 124, a control wire 126, a control pad 118, and a control via hole 122-1. These structures may be formed using a semiconductor process such as light exposure.

The test circuit 110-1s may be formed on the top surface of the first test substrate 100-1. Each test circuit 110-1 is electrically connected to a top surface pad 112-1 via the wires 124 formed on the top surface of the first test substrate 100-1. The top surface pads 112-1 are connected to the bottom surface pads 114-1 on the bottom surface of the first test substrate 100-1 via the signal via holes 116-1.

The control pads 118-1 may be electrically connected to the control apparatus 10. The control pads 118-1 may supply the test circuit 110-1s with control signals supplied from the control apparatus 10. The control pads 118-1 are electrically connected to the control pads 118-2 of the second test substrate 100-2 via the control via hole 122-1. As a result, the control signals from the control apparatus 10 are supplied to all of the test circuits 110.

The pads on the bottom surface of the first test substrate 100-1 may be respectively electrically connected to the pads on the top surface of the second test substrate 100-2, via a anisotropic sheet 150. The second test substrate 100-2 connected to the first test substrate 100-1 further includes, in addition to the configuration of the first test substrate 100-1, a plurality of bypass top surface pads 128-2, a plurality of bypass via holes 130-2, and a plurality of bypass bottom surface pads 132-2.

The bypass top surface pads 128-2 correspond one-to-one with the bottom surface pads of the test substrate 100 in the layer above this test substrate 100. Each bypass top surface pad 128-2 is electrically connected to a corresponding bottom surface pad.

The bypass bottom surface pads 132-2 are disposed on the bottom surface of the test substrate 100 and correspond one-to-one with the bypass top surface pads 128-2. The bypass via holes 130-2 correspond one-to-one with the bypass top surface pads 128-2. Each bypass via hole 130-2 is electrically connected to a corresponding top surface pad 128-2 and bottom surface pad 132-2.

The connecting unit 700 includes a plurality of connecting sections 710, a plurality of test circuit top surface pads 712, a plurality of wires 714, a plurality of connecting top surface pads 718, a plurality of connecting bottom surface pads 720, and a plurality of connecting via holes 722. The test circuit top surface pads 712 correspond one-to-one with the bottom surface pads of the test substrate 100 provided facing the connecting unit 700, and are each electrically connected to the corresponding bottom surface pad. The connecting unit 700 may be provided with a control pad 730 that receives control signals.

The connecting sections 710 are respectively electrically connected to the test circuit top surface pads 712. As a result, the connecting sections 710 are electrically connected to the test circuits 110 in each layer. The connecting sections 710 each electrically connect a test circuit top surface pad 712 to the connecting top surface pad 718. As a result, each connecting section 710 electrically connects a test circuit 110 in one of the layers to the corresponding connecting top surface pad 718.

Each connecting top surface pad 718 is electrically connected to a connecting bottom surface pad 720 through a connecting via hole 722. Each connecting bottom surface pad 720 is electrically connected to a pad of the wafer under test 300 via the anisotropic sheet 150 and the bumped membrane 160.

By providing each test substrate 100 with bypass via holes 130 allowing the test circuits 110 of a test substrate 100 in a higher layer to bypass this test substrate 100 and reach a test substrate 100 in a lower layer, in addition to the signal via holes 116 corresponding to the test circuits 110 of this test substrate 100, each test circuit 110 in each layer of test substrate 100 can be connected one at a time to the corresponding connecting section 710. Therefore, the connecting sections 710 can connect certain test circuits 110 from among the plurality of test circuits 110 to the chip under test 310.

Figure 4A:
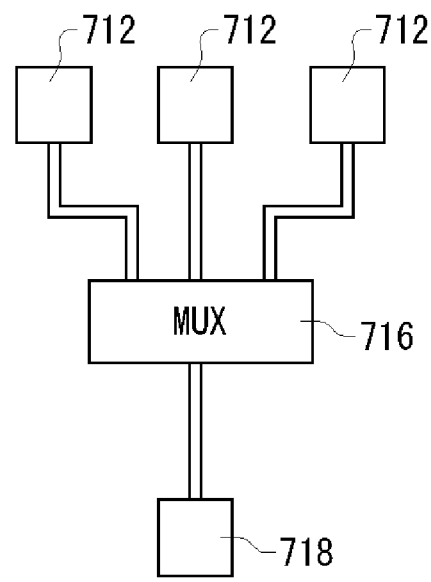
FIG. 4A shows an exemplary configuration of a connecting section 710.

FIG. 4A shows an exemplary configuration of a connecting section 710. The connecting section 710 in the present example includes a multiplexer 716. The multiplexer 716 is electrically connected to a plurality of test circuit top surface pads 712, selects one of the test circuit top surface pads 712, and electrically connects the connecting top surface pad 718 to the selected test circuit top surface pad 712. The multiplexer 716 may receive, from the control apparatus 10, a selection signal indicating which test circuit top surface pad 712 is to be selected. The control apparatus 10 may supply the selection signal to the multiplexer 716 via the control via hole 122. With this configuration, a variety of test circuits 110 can be connected to the chip under test 310.

The multiplexer 716 may receive a selection signal from a chip under test 310. In other words, each chip under test 310 may select a test circuit 110 to be connected thereto. Each chip under test 310 may select the next test circuit 110 to be connected thereto according to the test results of the chip under test 310 itself. A user or the like may store in advance, in each chip under test 310, data indicating the order in which the test circuits 110 are to be sequentially selected.

Figure 4B:
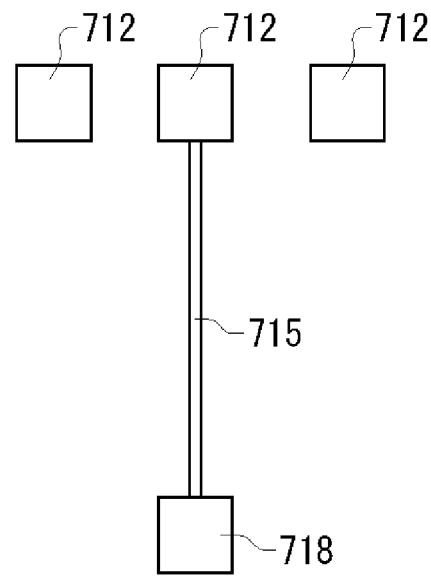
FIG. 4B shows another exemplary configuration of a connecting section 710.

FIG. 4B shows another exemplary configuration of a connecting section 710. The connecting section 710 of the present example includes a selecting wire 715. The selecting wire 715 electrically connects the corresponding connecting top surface pad 718 to one of the test circuit top surface pads 712. When the connecting section 710 has the configuration shown in FIG. 4B, the test system 200 preferably holds the connecting unit 700 in a manner to allow for replacement. By using a variety of connecting units 700 in which the selecting wires 715 of the connecting sections 710 have different connection arrangements, a variety of test circuits 110 can be connected to the chips under test 310.

Portions of the connecting unit 700 other than the selecting wires 715 can be formed using light exposure with a mask, for example. The selecting wires 715 may be formed using electron beam exposure. Since electron beam exposure performs exposure while controlling the emission direction of the electron beam, exposure can be performed without using a mask. Therefore, a plurality of types of connecting units 700 can be formed using a common mask. Furthermore, since portions other than the selecting wires 715 can be formed using light exposure, the connecting units 700 can be manufactured efficiently.

Figure 5:
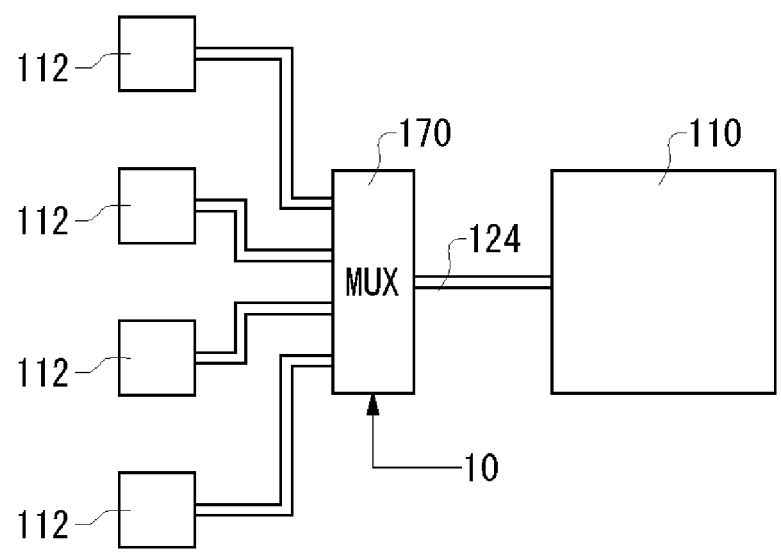
FIG. 5 shows in each test substrate 100.

FIG. 5 shows an exemplary connection of a test circuit 110 and top surface pads 112 in a test substrate 100. In the test substrate unit 400 described in relation to FIG. 3, each test substrate 100 has a different configuration, but in the present example, each test substrate 100 may have the same configuration.

Each test substrate 100 may include, for each test circuit 110, a number of top surface pads 112 corresponding to the number of test substrates 100 in the test substrate unit 400. Each top surface pad 112 is electrically connected to a wafer at a lower layer through a via hole and a bottom surface pad. In other words, each top surface pad 112 is electrically connected to a connecting section 710 of the connecting unit 700 through a via hole formed through each test substrate 100 layer.

Each test substrate 100 may include a multiplexer 170 for each test circuit 110. Each multiplexer 170 selects which top surface pad 112 the corresponding test circuit 110 is connected to. Each multiplexer 170 may receive, from the control apparatus 10, a control signal indicating which top surface pad 112 to select.

By forming top surface pads 112 and via holes having the same configuration in each test substrate 100 in this way, the via holes connected to the connecting sections 710 can be extended to the test substrate 100 at the topmost layer. At this time, connecting sections 710 in different test substrates 100 select top surface pads 112 at different positions. Furthermore, connecting sections 710 in the same test substrate 100 select top surface pads 112 at the same position. As a result, even when the order in which a plurality of test substrates 100 are layered is changed, each test circuit 110 can be connected to a connecting section 710. Furthermore, even when a test substrate 100 is exchanged for another test substrate 100, each test circuit 110 can be connected to a connecting section 710. The test system 200 may include a holding section to hold each test substrate 100 in a manner to allow for exchange.

Figure 6:
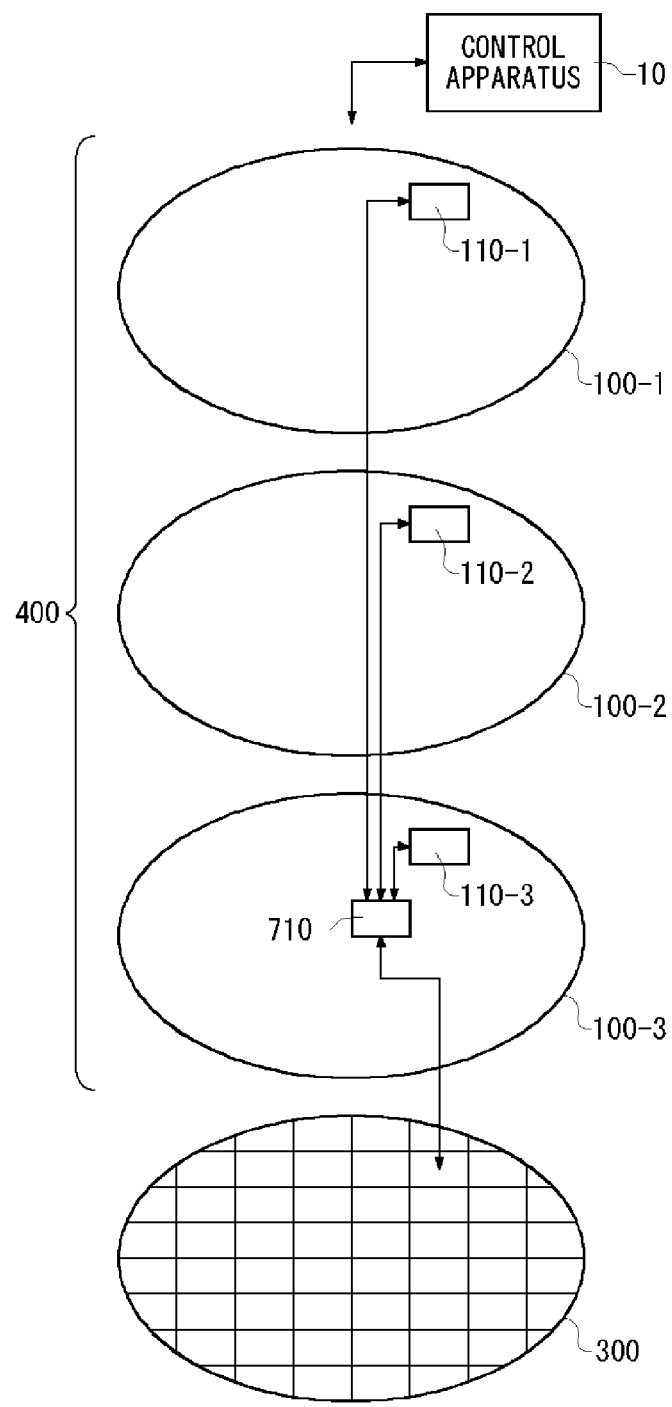
FIG. 6 shows another exemplary configuration of the test substrate unit 400.

FIG. 6 shows another exemplary configuration of the test substrate unit 400. The test substrate unit 400 of the present example differs from the test substrate unit 400 described in relation to FIG. 2 in that this test substrate unit 400 does not include a connecting unit 700.

The connecting sections 710 are disposed on the test substrate 100 located closest to the wafer under test 300. These connecting sections 710 are electrically connected to the test circuits 110 of the test substrates 100 in higher layers through via holes, in the same manner as the connecting sections 710 described in relation to FIG. 2, and are also connected to the test circuits 110 within the same test substrate 100. Each connecting section 710 electrically connects one of the test circuits 110 to the corresponding chip under test 310.

With this configuration as well, a variety of test circuits 110 can be connected to the chips under test 310. Therefore, a variety of tests can be performed on the chips under test 310. In the present example, the connecting sections 710 are disposed on the test substrate 100 at the bottommost layer, and therefore the test substrate 100 at the bottommost layer need not be held in an exchangeable manner. Furthermore, the test substrate 100 at the bottommost layer may include test circuits 110 that are used in common for a plurality of types of tests. For example, the test circuits 110 of the test substrate 100 at the bottommost layer may be power supply circuits that supply power to the chips under test 310.

The above describes an example in which a semiconductor wafer is used as the connecting unit 700, but as another example, the connecting unit 700 may be a probe card. The probe card may be formed as a unit that can be electrically connected to a plurality of chips under test 310, by disposing probe pins on a print substrate, for example. The connecting unit 700 may be a device using a anisotropic sheet. The anisotropic sheet is pressed by the pads of the test circuits 110 and the pads of the chips under test 310 to provide an electrical connection therebetween. In the above cases, the connecting sections 710 may include selecting wires 715 as shown in FIG. 4B.

A plurality of connecting units 700 may be provided. For example, the test system 200 may include, in addition to the connecting unit 700 arranged between the wafer under test 300 and a test substrate 100, connecting units 700 arranged between each pair of adjacent test substrates 100. The connecting units 700 arranged between test substrates 100 may switch which pad of a test substrate 100 each pad of a test substrate 100 at a layer above this test substrate 100 is connected to.

Figure 7:
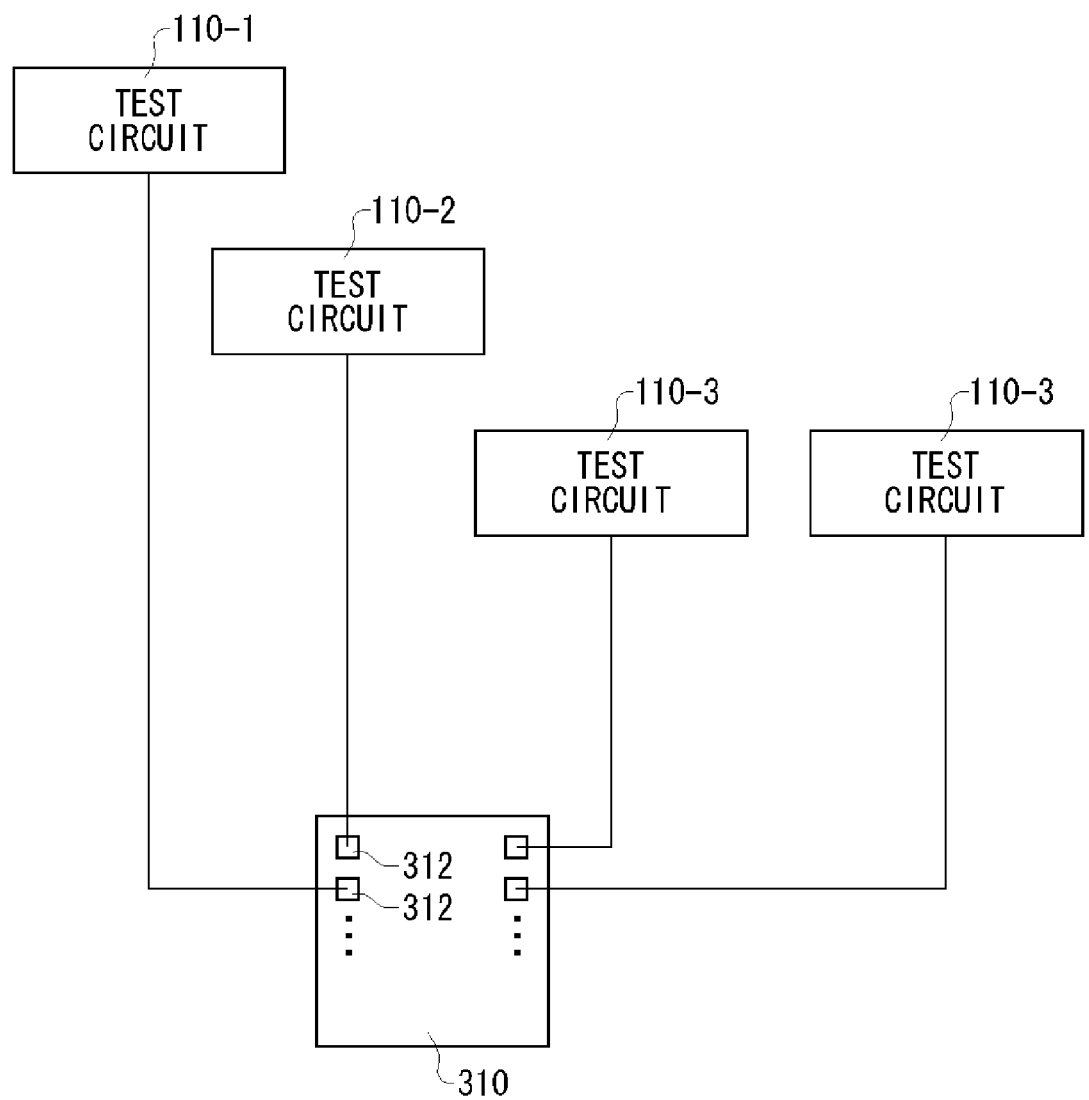
FIG. 7 shows the basics of another exemplary test system 200.

FIG. 7 shows the basics of another exemplary test system 200. The test system 200 in the present example does not include connecting sections 710, and tests a plurality of chips under test 310 using a plurality of test substrates 100. In this case, the test system 200 need not include a connecting unit 700. In the present example, each test substrate 100 may include test circuits 110 grouped according to their function.

In the present example, each test circuit 110 formed on a test substrate 100 exchanges signals with a chip under test 310 via one of the I/O pads 312 of the chip under test 310. In the test system 200 that includes connecting sections 710, the test circuits 110 selected by the connecting sections 710 are connected to chips under test 310, but in the present example, all of the test circuits 110 may be connected to the I/O pads 312 of the chips under test 310.

Each test substrate 100 may be provided to correspond with at least one I/O pad 312. In this case, each test circuit 110 in each test substrate 100 may be connected to a I/O pad 312, corresponding to the test substrate 100 in which the test circuit 110 is formed, in the corresponding chip under test 310. With this configuration, by exchanging each test substrate 100 with another type of test substrate 100, the test circuits 110 connected to the I/O pads 312 corresponding to the test substrate 100 in which the test circuits 110 are formed can be changed en bloc for the chips under test 310.

Furthermore, the test substrates 100 may be divided into groups for each of a plurality of functions including, for example, test circuits 110 for digital pattern input, test circuits 110 for control input, test circuits 110 for digital pattern measurement, and test circuits 110 for supplying power. With this configuration digital testing of the chips under test 310 can be performed.

If other tests are to be performed, prescribed test substrates 100 can be exchanged for other test substrates 100. For example, analog testing of the chips under test 310 can be achieved by exchanging the test substrate 100 for digital pattern input or the like for a test substrate 100 for analog signal input. If a test substrate 100 corresponds to a plurality of I/O pads 312, this test substrate 100 may include a mixture of types of test circuits 110 corresponding to the plurality of I/O pads 312.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, embodiments of the present invention can be used to realize a test system and a test substrate unit for testing a plurality of semiconductor chips formed on a semiconductor wafer.

What is claimed is:

1. A test system that tests a plurality of chips under test formed on a wafer under test, the test system comprising:
   a plurality of test substrates that are arranged in overlapping layers, each test substrate having a plurality of test circuits formed thereon;
   a plurality of connecting sections that transmit, to the plurality of chips under test, signals generated by the plurality of test circuits formed on one of the test substrates at a time; and
   a control apparatus that controls each of the test circuits;
   wherein each test substrate includes at least one via hole that enables the plurality of test circuits of a first one of the plurality of test substrates further from the wafer under test to bypass a second one of the plurality of test substrates closer to the wafer under test.

2. The test system according to claim 1, wherein each test substrate has formed thereon a plurality of test circuits having a function that is predetermined for the substrate.

3. The test system according to claim 2, further comprising a connecting unit disposed between the wafer under test and the test substrate closest to the wafer under test, wherein the plurality of connecting sections are disposed in the connecting unit to correspond respectively to the plurality of chips under test, and each connecting section connects the corresponding chip under test to a signal transmission path from one of the plurality of test circuits.

4. The test system according to claim 1, wherein each connecting section is electrically connected to one of the plurality of test circuits at a time in each test substrate, through the at least one via hole.

5. The test system according to claim 4, wherein each connecting section switches the test circuit electrically connected to the corresponding chip under test.

6. The test system according to claim 1, wherein each connecting section includes a selecting wire that electrically connects, to one of the corresponding via holes, a connection pad that is electrically connected to the corresponding chip under test.

7. The test system according to claim 1, wherein test circuits of test substrates that are closer to the wafer under test generate signals with higher frequencies.

8. The test system according to claim 1, wherein the plurality of connecting sections are disposed on the test substrate that is closest to the wafer under test, from among the plurality of test substrates.

9. A test substrate unit that tests a plurality of chips under test formed on a wafer under test, the test substrate unit comprising:
   a plurality of test substrates that are arranged in overlapping layers, each test substrate having a plurality of test circuits formed thereon; and
   a plurality of connecting sections that transmit, to the plurality of chips under test, signals generated by the plurality of test circuits formed on one of the test substrates at a time;
   wherein each test substrate includes at least one via hole that enables the plurality of test circuits of a first one of the plurality of test substrates further from the wafer under test to bypass a second one of the plurality of test substrates closer to the wafer under test.

10. A test system that tests at least one chip under test formed on a wafer under test, the test system comprising:
    a first test substrate including a first test circuit formed thereon;
    a second test substrate coupled to the first test substrate, the second test substrate including a second test circuit formed thereon; and
    a control apparatus that controls the first and second test circuits;
    wherein the first test substrate includes at least one via hole that enables the second test circuit of second test substrate to bypass the first test substrate.

11. A test substrate unit that tests a plurality of chips under test formed on a wafer under test, the test substrate unit comprising:
    a plurality of test substrates that are arranged in overlapping layers, each test substrate having a plurality of test circuits formed thereon, wherein each test substrate has formed thereon a plurality of test circuits having a function predetermined for the substrate;
    wherein each test substrate includes at least one via hole that enables the plurality of test circuits of a first one of the plurality of test substrates further from the wafer under test to bypass a second one of the plurality of test substrates closer to the wafer under test.

* * * * *